United States Patent
Bedeschi et al.

(10) Patent No.: US 7,257,039 B2
(45) Date of Patent: Aug. 14, 2007

(54) BIT LINE DISCHARGE CONTROL METHOD AND CIRCUIT FOR A SEMICONDUCTOR MEMORY

(75) Inventors: Ferdinando Bedeschi, Monza (IT); Claudio Resta, Villa di Tirano (IT); Roberto Gastaldi, Agrate Brianza (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 32 days.

(21) Appl. No.: 10/971,776

(22) Filed: Oct. 22, 2004

(65) Prior Publication Data
US 2005/0169095 A1    Aug. 4, 2005

(30) Foreign Application Priority Data
Oct. 22, 2003   (EP)   ................... 03103911

(51) Int. Cl.
*G11C 7/00*   (2006.01)
(52) U.S. Cl. .................. 365/203; 365/200; 365/230.06
(58) Field of Classification Search ................ 365/200, 365/230, 195, 230.06, 189.11
See application file for complete search history.

(56) References Cited

U.S. PATENT DOCUMENTS

| | | | |
|---|---|---|---|
| 4,858,192 A | * | 8/1989 | Tatsumi et al. ............. 365/200 |
| 5,748,545 A | | 5/1998 | Lee et al. |
| 5,901,093 A | * | 5/1999 | Hiltebeitel et al. ......... 365/200 |
| 6,044,028 A | | 3/2000 | Tomohiro et al. |
| 6,434,065 B1 | * | 8/2002 | Kobayashi et al. ......... 365/200 |
| 6,643,213 B2 | * | 11/2003 | Perner et al. .......... 365/230.06 |
| 2002/0089879 A1 | | 7/2002 | Kobayashi et al. |

FOREIGN PATENT DOCUMENTS

WO   W/O 98/14947 A   4/1998

OTHER PUBLICATIONS

European Search Report.

* cited by examiner

*Primary Examiner*—Gene N. Auduong
(74) *Attorney, Agent, or Firm*—Lisa K. Jorgenson; Graybeal Jackson Haley LLP; Bryan A. Santarelli

(57) ABSTRACT

A method of controlling a discharge of bit lines of a matrix of memory cells comprises conditioning a value of a current flowing through a bit line of the matrix during a bit line discharge phase to an absence of an indication of defectiveness of the bit line. The method allows preventing crowbar currents that otherwise flow during the bit line discharge phase when a defective bit line exhibits a short-circuit to a defective word line.

43 Claims, 4 Drawing Sheets

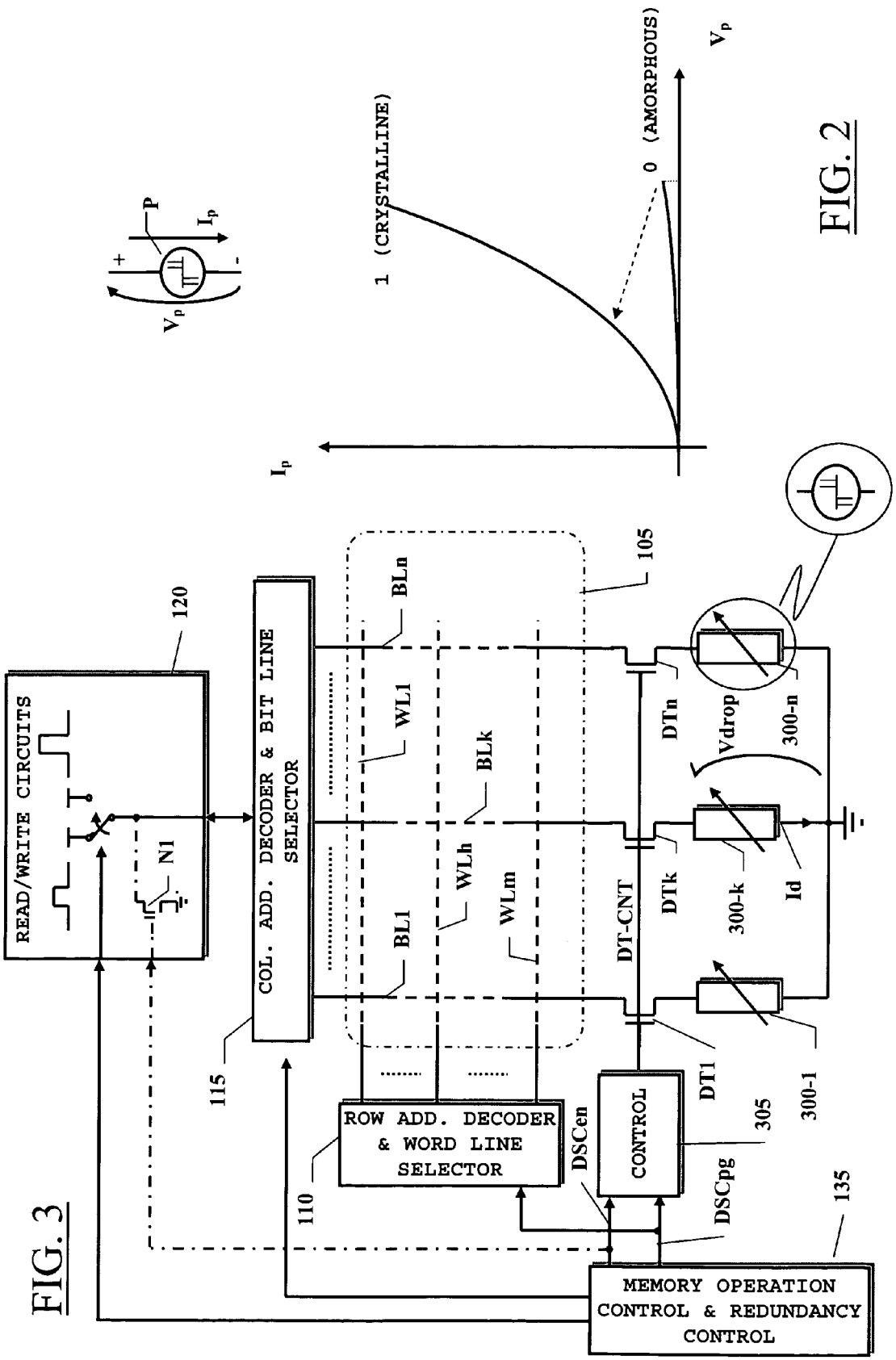

BIT LINE DISCHARGE CONTROL METHOD AND CIRCUIT FOR A SEMICONDUCTOR MEMORY

PRIORITY

This application claims priority from European patent application No. 03103911.8, filed Oct. 22, 2003, which is incorporated herein by reference.

TECHNICAL FIELD

The present invention generally relates to the field of semiconductor memories, particularly to non-volatile memories and, even more particularly, to memories based on phase-change materials, also known in the art as ovonic unified memories. More specifically, the invention relates to an improved bit line discharge control method, and a related circuit, for controlling the discharge of bit lines in a matrix of memory cells, particularly phase-change memory cells.

BACKGROUND

Ovonic unified or phase-change memories are an emerging type of electrically-alterable non-volatile semiconductor memory. These memories exploit the properties of materials (phase-change materials) that can be reversibly switched between an amorphous phase and a crystalline phase. A phase-change material exhibits different electrical characteristics, particularly a different resistivity, peculiar of each one of the two phases; thus, each material phase can be conventionally associated with a corresponding one of the two logic values, "1" and "0". An example of a phase-change semiconductor memory is described in U.S. Pat. No. 5,166,758.

Typically, the memory includes a matrix of phase-change memory cells, arranged in rows and columns with associated word lines and bit lines, respectively. Each memory cell consists of a storage element connected in series to an access element; as the access element, the base-emitter junction of a bipolar junction transistor, particularly a PNP BJT, associated with the storage element can be used.

In a stand-by condition, or before any read or write access to the memory, the word lines are kept at a relatively high voltage (word line deselection voltage), so that all the access elements are reverse biased.

During a write or read operation, the voltage of a selected word line is lowered, and one or more selected bit lines are brought to a voltage corresponding to the operation to be performed, while the remaining, non-selected bit lines are left floating. In this condition, the access elements associated with the memory cells of the selected word line and of the selected bit lines are forward biased, and the access to the corresponding storage elements is enabled.

However, leakage currents inevitably flow through the access elements even when they are reverse biased; the leakage currents, delivered to the access elements by the word line drivers, cause the charging of stray capacitances intrinsically associated with the bit lines, and the voltage of the bit lines raises, therefore, towards the word line deselection voltage.

If, as a consequence of the leakage currents, the voltage of a generic bit line reaches and, possibly, exceeds the turn-on voltage of the access elements (the threshold voltage of the base-emitter junction diodes, typically 0.6 V), an undesired access to the storage element that belongs to such a bit line and to a selected word line takes place, even if the bit line is actually kept unselected.

In this condition, the current flowing through the spuriously selected storage element may cause the voltage of the selected word line to rise, disturbing the operation of the memory device. Even worse, when the current flowing through the spuriously selected storage element reaches a value sufficient to cause a switch of phase in the phase-change material, the phase switch can cause an undesired change of the logic value stored in that memory cell. Even when the phase switch is only temporary and not permanent, a wrong value can be read if the memory cell is selected before a corresponding recovery time.

These problems are exacerbated as the temperature increases, since the leakage currents typically depend on the temperature according to an exponential law. In addition, the total leakage current injected into each storage element in the selected word line is directly proportional to the number of access elements in the corresponding deselected bit line.

For these reasons, before any operation involving the selection of a word line, the bit line voltage has to be brought to a properly low value, typically to ground, and thus the bit line stray capacitances need to be discharged. To this purpose, controlled switching elements, typically pass transistors, are associated with the bit lines, which are activated during a bit line discharge phase preceding any operation that involves the selection of a word line, so as to electrically connect the bit lines to a reference voltage line, for example, the ground line, and to discharge the associated stray capacitances.

A problem arises when, due to a manufacturing defect, a short-circuit (or, generally, a low-resistance path) exists between a generic bit line and a generic word line of the matrix. Especially in very dense memory matrices, this type of defect may be relatively highly probable. Known redundancy techniques allow repairing such a defect, by functionally replacing the defective bit line and word line with redundant bit line and word line; any attempt of selecting the defective bit line and word line would automatically result in a selection of the redundant bit line and word line.

Regretfully, according to the known approach, during the bit line discharge phase, before the desired word line is selected (thus, when all the word lines are still kept at the word line deselection voltage), the short-circuit between the defective word line and bit line causes a short-circuit between the word line driver supply voltage line (the line supplying the word line deselection voltage to the word line driver) and the reference voltage line; this short-circuit causes the flow of a significant crowbar current, for a time corresponding to the activation time of the bit line discharge pass transistors (typically, some tens of nanoseconds). This may easily cause the memory to exhibit an unacceptably high power consumption. Additionally, when the word line deselection voltage is generated on-chip by means of charge-pump voltage generators, the excessive current absorption due to the short circuit may easily cause the charge-pump output voltage to fall below a safety level, with the consequence that the correct operation of the whole memory might be prejudiced (for example, a too low word line deselection voltage may prevent the proper deactivation of the memory cell access elements, with the possible consequence that the data stored in the memory cells of the selected bit line are corrupted).

SUMMARY

In view of the state of the art outlined in the foregoing, an embodiment of the present invention solves the above-mentioned problems.

In particular, this embodiment of the present invention avoids the flow of any significant crowbar current from the word line driver supply voltage line to the reference voltage line in presence of manufacturing defects consisting of a short-circuit between a bit line and a word line.

Generally stated, it has been found that in order to avoid undesired and, possibly, even dangerous crowbar currents, one can condition the way in which the bit line discharge operation is accomplished to the fact that a bit line may be defective.

Briefly stated, a method according to an embodiment of the invention comprises conditioning a value of a current flowing through a bit line during a bit line discharge phase to an absence of an indication of defectiveness of the bit line.

A circuit according to an embodiment of the invention comprises bit line discharge means, associated with the bit lines, activatable in a bit line discharge operating phase of the memory for enabling a discharge of bit line capacitances associated with the bit lines.

Bit line current control means are additionally provided, controllable for at least limiting a current of an associated bit line in the bit line discharge operating phase.

BRIEF DESCRIPTION OF THE DRAWINGS

These and other features and advantages of the present invention will be made apparent by the following detailed description of some embodiments thereof, provided merely by way of non-limitative examples, that will be conducted making reference to the attached drawings, wherein:

FIG. 2 shows current-voltage (I-V) characteristic curves of a variable-resistance, phase-change programmable non-volatile storage element used in memory cells of the memory of FIG. 1 according to an embodiment of the invention;

FIG. 3 shows an exemplary practical implementation of the bit line discharge control schematically depicted in FIG. 1, according to an embodiment of the present invention;

DETAILED DESCRIPTION

Figure 1:
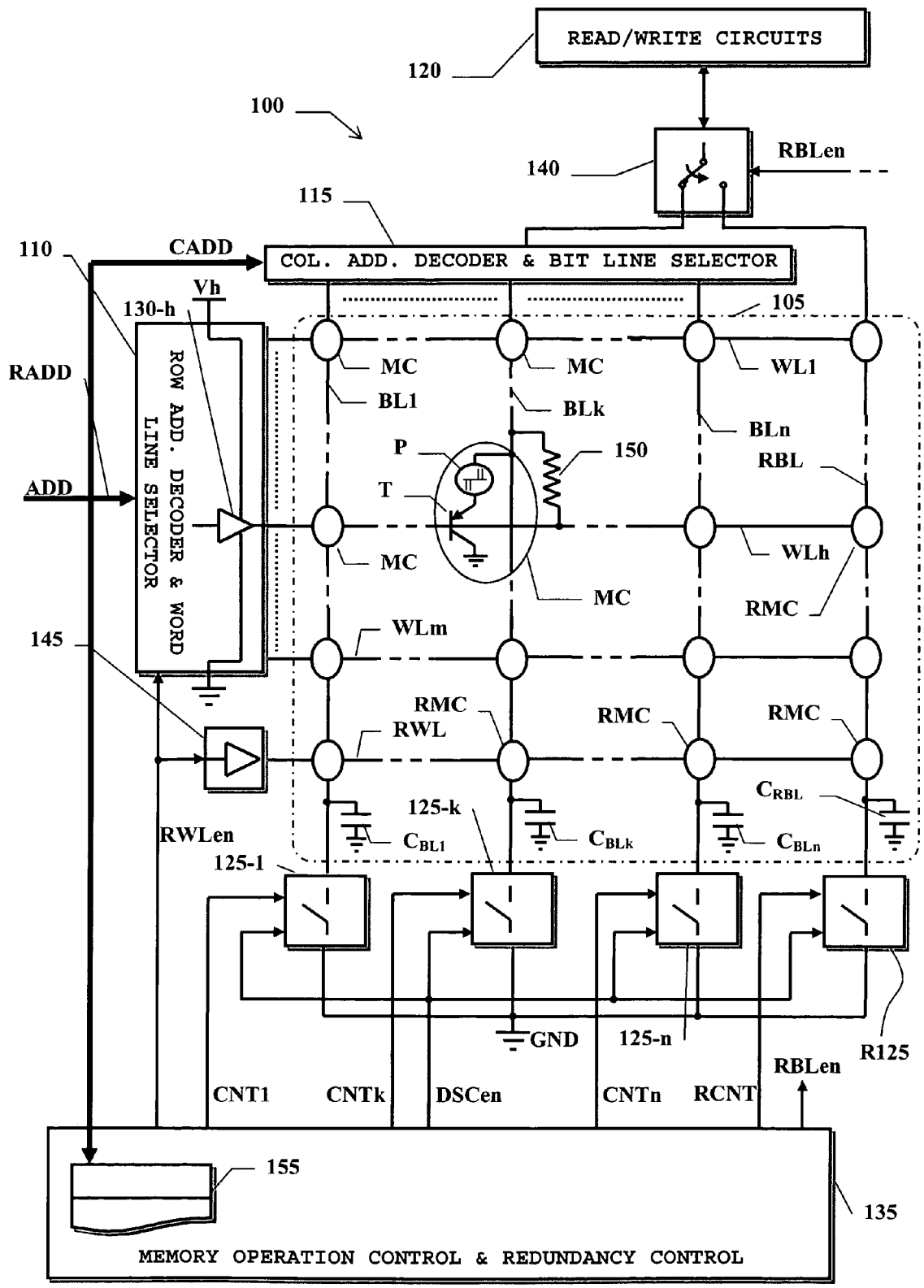
FIG. 1 shows the relevant circuit blocks of a memory featuring a bit line discharge control, according to an embodiment of the present invention.

With reference to the drawings, in FIG. 1 the relevant functional blocks of a semiconductor memory 100 according to an embodiment of the present invention are shown. Specifically, the semiconductor memory 100 is an ovonic unified electrically-alterable non-volatile memory device.

The memory 100 includes a two-dimensional arrangement or matrix 105 of a plurality of memory cells MC; the memory cells MC in the matrix 105 are arranged by, e.g., m rows and n columns; a respective word line WL1-WLm is associated with each matrix row, and a respective bit line BL1-BLn is associated with each matrix column.

Each memory cell MC in the matrix 105 includes a programmable storage element P having a programmable resistivity; the programmable storage element P is connected in series to an associated access element, in the shown example consisting of the emitter-base junction of a PNP Bipolar Junction Transistor (BJT) T which is associated with the programmable element P.

Each programmable storage element P is made of a phase-change material; typically, the phase-change material consists of a calcogenide (e.g., a $Ge_2Sb_2Te_5$ alloy). The phase-change material can be reversibly switched between a generally amorphous, disordered phase and a generally crystalline, highly ordered phase. The two phases of the material exhibit different electrical characteristics, as depicted in FIG. 2, wherein Vp and Ip denote the voltage across and the current flowing through the generic programmable storage element P, respectively; particularly, when the material is in the amorphous phase, it exhibits a relatively high resistivity, whereas when the material is in the crystalline phase, it has a low resistivity. It is the material resistivity difference in the two phases that is exploited to store a binary value; if the programmable storage element P is in the amorphous phase, characterized by a high resistivity, the memory cell MC is conventionally considered in a reset state, and this state is associated with a binary value, for example a "0"; if the programmable storage element P is in the crystalline phase, characterized by a low resistivity, the memory cell MC is conventionally considered in a set state, which is associated with the opposite binary value, in the example herein considered a "1".

Without entering into particulars, which are per-se well known in the art, the phase of the phase-change material is stable below a predefined temperature (such as 150° C.). The material phase can be changed by heating the material over such a temperature; for this purpose, a voltage Vp higher than a corresponding phase-change value Vpc (for example, 0.6V) is applied to the programmable storage element P; the applied voltage causes the flow of a current Ip through a resistive element placed in contact with the phase-change material of the programmable storage element P, which resistive element acts as a local Joule-effect heater, and accordingly raises the temperature of the phase-change material. Depending on the voltage applied thereacross, and thus on the current flowing therethrough, if the programmable storage element P is heated over a nucleation temperature (typically 200° C.) and then cooled slowly, the phase-change material becomes crystalline; conversely, if the programmable storage element P is heated over a higher, melting temperature (such as 600° C.) and then cooled rapidly, the phase-change material becomes amorphous.

The state of the programmable storage element P can be detected by applying thereacross a read voltage (suitably lower than the phase-change value Vpc, not to cause an undesired change of phase of the material). The resulting current that flows through the programmable storage element P has a value that depends on the resistivity of the phase-change material, and provides therefore an indication of the material phase.

Still referring to FIG. 1, each memory cell MC in the matrix 105 is connected to a respective one of the word lines WL1-WLm and a respective one of the bit lines BL1-BLn. In particular, within each memory cell MC the programmable storage element P has a first terminal connected to the corresponding bit line BL1-BLn and a second terminal connected to the emitter terminal of the associated BJT T; the BJT T has the base terminal connected to the corresponding word line WL1-WLm and the collector terminal connected to a reference voltage line, typically the ground.

A generic memory cell MC within the matrix 105 is accessed by selecting the corresponding row and column pair, i.e. by selecting the corresponding word line and bit line pair. To this purpose, word line selector circuits 110 and bit line selector circuits 115 are provided; these circuits, known per-se and therefore merely schematized as blocks in the drawings, perform the selection of the word lines and of the bit lines on the basis of a row address binary code RADD and a column address binary code CADD, respectively, part of a memory address binary code ADD, for example received by the memory device 100 from a device external to the memory (e.g., a microprocessor). The word line selector circuits 110 decode the row address code RADD and select a corresponding one of the word lines WL1-WLm, identified by the specific row address code RADD received; the bit line selector circuits 115 decode the column address code CADD and select a corresponding one or, more generally, a corresponding bit line packet of the bit lines BL1-BLn, depending on the degree of parallelism of the memory device 100, i.e. on the size of the memory locations (typically, eight or sixteen bits), identified by the specific column address code CADD received.

The bit line selector circuits 115 interface with read/write circuits, also known per-se and therefore schematized as a block 120. The read/write circuits 120 include all the components (e.g., sense amplifiers, comparators, reference current/voltage generators, pulse generators, program load circuits and the like) which are normally required for writing the desired logic values into the selected memory cells MC, and for reading the logic values currently stored therein.

As discussed in the introductory part of the present description, in a stand-by operating condition, as well as before any read or write access to the memory device 100, the word line selection circuits 110 keep all the word lines WL1-WLm at a relatively high voltage Vh, also referred to as the word line deselection voltage (a typical value of this voltage may for example be 4.5V; a similar voltage is used for keeping the word lines deselected during a memory write operation); the word line deselection voltage Vh is such that the emitter-base junction of the BJT T in every memory cell MC is kept reverse biased; in this way, none of the memory cells MC is accessed, because all the access elements are disabled. At the same time, the bit line selection circuits 115 keep all the bit lines BL1-BLn disconnected, and thus isolated, from the read/write circuits 120.

During a read or a write operation, the word line selection circuits 110 lower the voltage of a selected one of the word lines WL1-WLm to a word line selection voltage Vl (having for example value equal to 0V—the ground), while the remaining word lines are kept at the word line deselection voltage Vh; similarly, the bit line selection circuits 115 couple a selected one of the bit lines BL1-BLn (more typically, a selected bit line packet of, e.g., eight or sixteen bit lines, depending on the degree of parallelism of the memory 100) to the read circuits or to the write circuits, depending on the operation to be performed; the selected bit lines are brought to a voltage corresponding to the operation to be performed, while the remaining, non-selected bit lines are left floating. In this condition, the access elements associated with the memory cells MC belonging to the selected word line and the selected bit lines are forward biased, and enable the access to the corresponding storage elements P.

In greater detail, the voltage applied to the selected bit lines is always comprised between a base-emitter threshold voltage Vbe of the access transistors T (typically, 0.6V) and the voltage difference (Vh−Vbe) (typically, 4.5−0.6=3.9V). Therefore, only the base-emitter junctions of the access transistors that are associated with the selected word line and the selected bit lines are forward biased, while the base-emitter junctions of the other access transistors T should remain reverse biased at a voltage at least equal to −Vbe.

In particular, during a write operation a relatively high voltage pulse is applied to each selected bit line; the voltage pulse has an amplitude and a time duration depending on the desired final state of the correspondingly selected programmable element P (crystalline or amorphous). On the other hand, during a read operation a relatively low voltage (for example, 1V) is applied to the selected bit lines. In the read/write circuits 120, the current flowing through each corresponding programmable element P is compared to a reference value (typically provided by a reference memory cell); when the programmable element P is in the crystalline state, a current higher than the reference value is detected, and this situation is conventionally decreed to correspond to the logic value "1", whereas when the programmable element P is in the amorphous state, a current lower than the reference value is detected, and this situation is conventionally decreed to correspond to the logic value "0".

As mentioned in the introductory part of the present description, malfunctionings of the memory device may be induced by leakage currents that flow through the base-emitter junctions of the access BJTs T even when the base-emitter junctions thereof are reverse-biased; during the memory device stand-by or, generally, before a read or write operation, these leakage currents, delivered by word line drivers in the word line selection circuits 110 (such as the word line driver 130-h, schematically represented in FIG. 1 and associated with the word line WLh), cause the charging of stray capacitances $C_{BL1}$-$C_{BLn}$ intrinsically associated with the bit lines BL1-BLn; the voltage of the bit lines raises therefore towards the word line deselection voltage Vh.

In order to avoid the already cited problems of spurious access to undesired memory cells, caused by this rise of the bit line voltage, the bit line stray capacitances $C_{BL1}$-$C_{BLn}$ need to be discharged before performing any operation that involves the selection of a word line WL1-WLm, such as a memory read or a write operation.

To this purpose, bit line discharge circuits 125-1-125-n are provided, associated with each bit line BL1-BLn; the bit line discharge circuits 125-1-125-n are enabled in a bit line discharge phase of the memory device operation, preceding any operation that involves the selection of a word line WL1-WLm, for discharging the bit line stray capacitances $C_{BL1}$-$C_{BLn}$.

As known in the art, the generic bit line discharge circuit 125-1-125-n is simply implemented by means of a transistor, particularly an N-channel MOSFET having the drain terminal connected to the corresponding bit line, the source terminal connected to the reference voltage line (e.g., the ground GND) and the gate terminal controlled by a discharge enable signal. Before a write or a read operation, the discharge enable signal is temporarily asserted to a sufficiently high positive voltage, so that all the discharge MOSFETs turn on and connect the bit lines to the reference voltage line. The discharge currents that flow through the discharge transistors cause the discharge of the bit line stray capacitances and the fall of the bit line voltage to the reference voltage, e.g., the ground. Then, before selecting the desired word line, the discharge enable signal is deasserted and the discharge MOSFETs turned off.

As discussed in the introduction to the present description, this known solution is not particularly satisfactory. Manufacturing processes of integrated circuits are inherently affected by defectiveness, especially in the early stages of a newly-developed manufacturing technology. Semiconductor memories, being characterized by a very large integration scale, are greatly affected by manufacturing defects. Within a semiconductor memory, defects in the memory cell matrix 105 are highly probable; unfortunately, a defect that impairs the functionality of even a single memory cell MC may cause the whole memory device to be discarded, with a consequent significant reduction of the process yield, and an increase of costs. For this reason, redundant memory cells are normally provided in the memory, organized for example by redundant word lines and/or redundant bit lines that are used for functionally replacing a defective word line or bit line. This is shown in a simplified way in FIG. 1, wherein reference numerals RWL and RBL identify a redundant word line and, respectively, a redundant bit line, i.e., a word line and a bit line of redundant memory cells RMC, structurally identical to the memory cells MC and provided in the memory matrix 105 in addition to the memory cells MC that would be necessary for achieving the desired storage capacity. A redundancy control circuitry is provided, known per-se and therefore not shown in detail (in the drawing, a block 135 is intended to include the redundancy control circuitry as well as the memory operation control circuitry). Under the control of the redundancy control circuitry 135, the redundant bit line RBL is exploited to functionally replace a defective bit line among the bit lines BL1-BLn, and the redundant word line RWL is similarly exploited to functionally replace a defective word line among the word lines WL1-WLm. For example, if it is detected that the bit line BLk contains a defective memory cell MC, an address code of the defective bit line is stored in the redundancy control circuitry 135 (for example, in a non-volatile Content-Addressable Memory or CAM 155); the redundancy control circuitry 135 constantly compares the currently supplied address code to the stored address code; in case coincidence is detected, the access to the defective bit line BLk is prevented and, in turn, the redundancy bit line RBL is accessed and coupled to the read/write circuits 120 (in FIG. 1 this operation is represented by a switch 140, controlled by the redundancy control circuitry through a redundant bit line selection signal RBLen, and interposed between the bit line selection circuits and the redundancy bit line, on one side, and the read/write circuits, on the other side). Similarly, if the redundant word line RWL is exploited for functionally replacing the defective word line WLh, an address code thereof is stored in the (CAM of the) redundancy control circuitry and, in case of coincidence of the stored defective word line address code with the currently supplied address code, the redundant word line RWL is selected in place of the defective word line WLh (in FIG. 1 this operation is schematically represented by the provision of a redundant word line selector block 145, driven by a redundant word line selection signal RWLen which is also used to disable the word line selection circuits 110).

A defect that is rather frequently encountered in a matrix of memory cells is the existence of a low-resistance path, or even a short-circuit 150 between one BLk of the matrix bit lines BL1-BLn and one WLh of the matrix word lines WL1-WLm. Albeit this type of defect can be repaired in the way described in the foregoing, by functionally replacing the defective bit line BLk and the defective word line WLh short-circuited thereto with a redundant pair of bit line RBL and word line RWL, the implementation of the known solution adopted for discharging the bit line stray capacitances would result in a significant crowbar current flowing, from the word line deselection voltage distribution line Vh to the reference voltage distribution line, through the word line driver 130-*h*, the short-circuit 150 and the discharge MOSFET 125-*k* associated with the defective bit line BLk. This may easily cause the memory to exhibit an unacceptably high power consumption and, when the word line deselection voltage is generated on-chip by means of charge-pump voltage generators, the excessive current absorption may easily cause the charge-pump output voltage to fall below a safety level, with the consequence that the operation of the entire memory might be prejudiced.

In order to solve this problem, according to an embodiment of the present invention, the bit line discharge circuits 125-1-125-*n* are controllable so as to exhibit at least three different operating modes: a first operating mode, in which the bit line discharge is inhibited, and no discharge current is allowed to flow; a second operating mode, in which the bit line discharge is enabled, and a relatively large bit line discharge current is allowed to flow; and a third operating mode, in which, although the bit line discharge is enabled, the bit line discharge current is at least substantially limited in value, possibly substantially reduced to zero.

As depicted in FIG. 1, each bit line discharge circuit 125-1-125-*n* receives from the control circuitry 135 a common discharge enable signal DSCen, asserted by the control circuitry 135 in the bit line discharge phase that precedes any operation involving the selection of a generic word line, so as to enable the discharge of the bit line stray capacitances. In addition, each bit line discharge circuit 125-1-125-*n* receives from the control circuitry 135 a respective control signal CNT1-CNTn, for selecting the bit line discharge circuit 125-1-125-*n* operating mode among the second and third operating modes cited above. For example, when the generic control signal CNTk is kept deasserted, upon assertion of the discharge enable signal DSCen the corresponding bit line discharge circuit 125-*k* allows a relatively high discharge current to flow, thereby allowing a relatively fast discharge of the stray capacitance CBLk associated with the bit line BLk. On the contrary, if the generic control signal CNTk is asserted, upon assertion of the discharge enable signal DSCen the bit line discharge circuit 125-*k* does not allow the flow of a relatively high discharge current, and instead significantly limits, or even reduces substantially to zero, the current that can flow through the bit line BLk. Exploiting this peculiar operation mode of the bit line discharge circuits 125-1-125-*n*, it is possible to avoid the substantial crowbar current that, in the solution known in the art, would flow when a defective bit line (the bit line BLk in the shown example) has been found to be short-circuited to a word line WLh: it is in this case sufficient that the bit line discharge circuit 125-*k*, associated with the defective bit line, is individually controlled so as to at least substantially limit the discharge current that can flow therethrough.

It is observed that the generic control signal CNT-k may be used either as a control signal, controlling the operating mode and particularly the activation of the respective bit line discharge circuit 125-*k* each time a bit line discharge phase is entered (i.e., when the signal discharge enable signal DSCen is asserted), or, alternatively, as a set signal, used in a setting phase of the bit line discharge circuit 125-*k* for setting, substantially once and for all, the bit line discharge circuit 125-*k* in the desired, discharge current-limiting operating mode, for example at the time the defect in the bit line BLk is discovered and the defective bit line is repaired by means of a redundant bit line RBL, so that each time the discharge enable signal DSCen is asserted, the discharge circuit 125-*k* automatically enters the current-limiting operating mode.

It is also observed that a bit line discharge circuit R125, controlled by a control signal RCNT and similar to those 125-1-125-*n* associated with the bit lines BL1-BLn is also associated with the redundancy bit line RBL, for allowing the discharge of a stray capacitance CRBL associated therewith.

In the following, some practical embodiments of the present invention will be described, being intended that none of the described embodiments is to be construed as limitative, but merely as exemplary.

Referring to FIG. 3, associated with each bit line BL1-BLn a respective bit line discharge circuit is provided, including a discharge-enabling transistor DT1-DTn, particularly but not limitatively an N-channel MOSFET, with a drain electrode connected to the respective bit line and the source electrode connected to a first terminal of a variable impedance element 300-1-300-*n*, particularly a variable resistance element, having a second terminal connected to the reference voltage line. The variable resistance elements 300-1-300-*n* have a resistance variable in a controlled way between at least a first and a second values, the first resistance value being relatively low, whereas the second resistance value is substantially higher. Expediently, especially from a manufacturing process viewpoint, the variable resistance elements 300-1-300-*n* are formed by phase-change material elements similar to those making up the storage elements P of the memory cells MC.

The control electrodes of all the discharge-enabling transistor DT1-DTn are driven by a common control signal DT-CNT, generated by a control circuit 305. The operation of the control circuit 305 is controlled by the memory control circuit 135 through the bit line discharge enable signal DSCen and a bit line discharge circuit program enable signal DSCpg.

The provision of the variable resistance element 300-1-300-*n* in series to the discharge-enabling transistor DT1-DTn allows controlling the bit line discharge current: the discharge current flowing through the generic variable resistance element 300-1-300-*n* (e.g., the current Id flowing the element 300-*k*) produces a voltage drop (Vdrop) thereacross that depends on the resistance of the variable resistance element; the amount of the voltage drop affects the gate-source drive voltage of the transistor DT1-DTn. Thus, in case the variable resistance element 300-1-300-*n* is in the low resistance state, the voltage drop thereacross is substantially zero, the respective transistor DT1-DTn will experience a full gate-source drive voltage, and the flow of a relatively high discharge current will be sustained. On the contrary, if the variable resistance element is in to the high resistance state, a negative feedback control loop is automatically created, thereby the discharge current is automatically limited to a desired value: an increase in the discharge current would produce an increased voltage drop across the variable resistance element 300-1-300-*n*, and thus a reduction in the gate-source drive voltage of the transistor DT1-DTn, and a consequent reduction in the discharge current; for a sufficiently high resistance value, the discharge current is substantially reduced to zero.

The specific first and second resistance values are not critical per-se; it is sufficient that the first resistance value is low enough not to cause a significant reduction of the drive of the corresponding transistor DT1-DTn, while the opposite holds true for the second resistance value, depending on the discharge current, the transistor dimensions and the like.

The control circuit 305 is like a controlled variable voltage generator, adapted to generate variable voltage levels (either discrete or continuous, for example voltage ramps) depending on the operations to be performed, namely programming of the variable resistance elements 300-1-300-*n* or enabling of the bit line discharge, as determined by the state of the control signals DSCen and DSCpg.

In particular, and by way of example, during a bit line discharge phase, the assertion of the bit line discharge enable signal DSCen by the memory control circuit 135 causes the control circuit 305 to drive the control signal line DT-CNT (normally kept at, e.g., the reference voltage) to a first voltage, sufficient to cause the transistors DT1-DTk to turn on, so as to enable the flow of a discharge current. It is observed that the value of this first voltage is determined on the basis of the need of preventing that, during the bit line discharge phase, the voltage across the phase-change elements 300-1-300-*k* exceeds the phase-change material switching value, not to alter their state. In particular, in order to ensure that the state of the phase-change elements 300-1-300-*k* is not changed during a bit line discharge, the following relations need to be satisfied:

$$Id = K^*(Vd - Ri^*Id - Vth)^2, \text{ with } Ri^*Id < Vtr$$

where Id the discharge current, flowing through the generic transistor DTk and the associated variable resistance element 300-*k*, Vd is the voltage at the gate of the transistor DTk, Ri is the resistance of the variable resistance element 300-*k*, Vth is the threshold voltage of the transistor DTk, K is the proportionality constant of the transistor DTk (assumed to operate in saturation when activated), and Vtr is the threshold voltage of the calcogenide material. A suitable voltage may for example be 1.5V.

It is observed that instead of a digital signal, taking only two discrete voltage values (a lower, transistor turn-off voltage for disabling the transistors DT1-DTn, and a higher, transistor turn-on voltage for enabling the transistors), the control circuit 305 may generate an analog signal, for example a voltage ramp (or a staircase signal). The adoption of a voltage ramp is considered preferable, because in this way the discharge of the bit line stray capacitances is better controlled, and in particular the ramp-up current is kept limited.

In order to set the variable resistance elements 300-1-300-*n* in either one of the two (low resistance or high resistance) states, the memory control circuit 135 asserts the signal DSCpg. A procedure totally similar to that adopted for programming a generic memory cell MC in the array 105 may be expediently adopted (with the exception that the word line selector 110 keeps all the word lines WL1-WLm deselected, so as to prevent the memory cells MC belonging to the selected bit line from being programmed). Specifically, in order to program the variable resistance element 300-*k* associated with the generic bit line BLk, such a bit line is caused to be selected by the bit line selection circuits 115 and coupled to the write circuits 120 (to this purpose, the memory control circuitry 135 may internally furnish to the bit line selection circuits 115 the address code of the bit line BLk). The write circuits bias the bit line BLk at the proper voltage, depending on the state desired for the variable resistance element 300-1-300-*n* (crystalline—low resistance, or amorphous—high resistance). The assertion of the control signal DSCpg causes the control circuit 305 to place on the control signal line DT-CNT a voltage suitable to cause the flow through the phase-change material element forming the variable-resistance element 300-*k* of a current adapted to cause the element to be programmed in the desired state; for example, a first, lower programming voltage of, e.g., 1.5 V is placed on the control signal line DT-CNT to cause the selected variable resistance element 300-1-300-*n* to be set, while a second, higher programming voltage of, e.g., 3 V is used to cause the variable resistance element to be reset. The signal DSCpg can also be exploited to keep the word line selector 110 disabled, thereby the word lines WL1-WLm are kept deselected.

Should the variable resistance elements 300-1-300-*n* need a periodical refresh of their programming state, this operation might be expediently performed during a bit line discharge operation (provided that the duration of the bit line discharge operation is sufficient for this purpose). In this way, the refresh operation is made completely transparent to an external user of the memory 100.

It is also observed that a measure for reducing the dimensions of the transistors DT1-DTk (and thus the semiconductor area) may call for providing, in the read/write circuits 120, an additional transistor, for example an N-channel MOSFET shown in phantom in FIG. 3 and identified therein by N1, arranged for contributing to the discharge of the selected bit line.

It is observed that although the exploitation of the write circuits already provided in the memory for programming the memory cells MC of the matrix 105 is clearly advantageous, nothing prevents the designer from providing dedicated write circuits for writing the variable resistance elements 300-1-300-*n*. Also, it is observed that the exploitation of phase-change calcogenides for implementing the variable resistance elements is not limitative to the present invention: any other component adapted to exhibit a selectively programmable, variable resistance can be used, for example a variable threshold voltage MOS transistor of the type used in electrically alterable semiconductor memories such as Flash memories.

Figure 4:
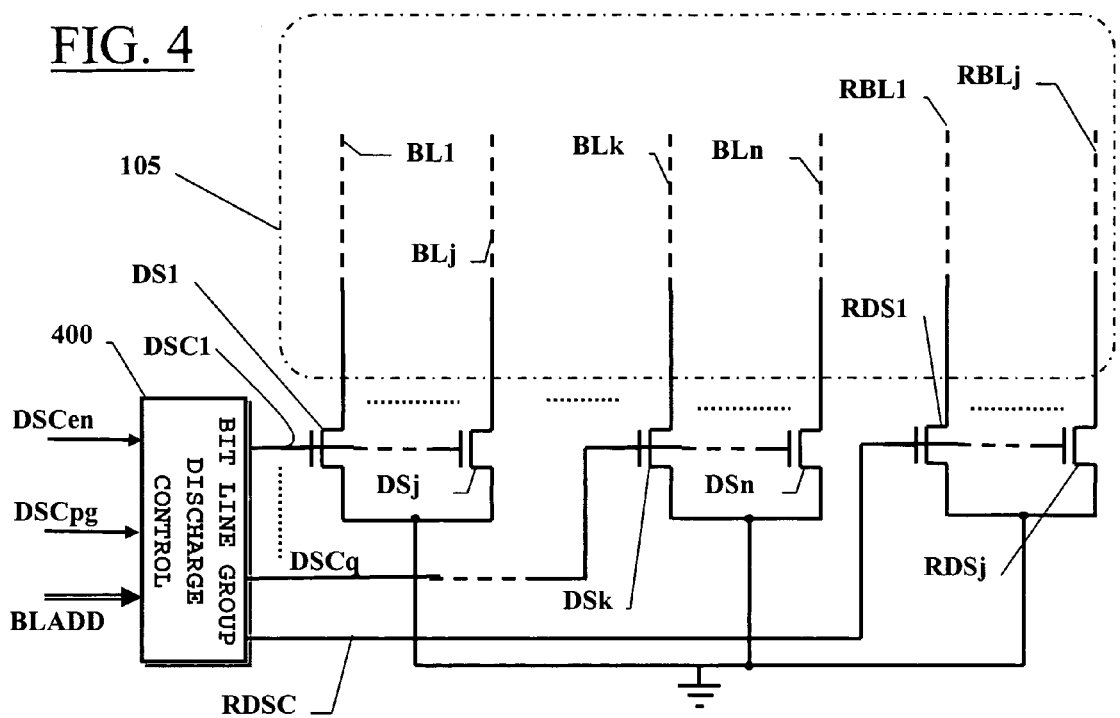
FIG. 4 shows another exemplary practical implementation of the bit line discharge control depicted in FIG. 1, according to another embodiment of the present invention.

Another possible practical implementation of the present invention is schematically depicted in FIG. 4. In this case, instead of providing programmable variable resistance elements in series to the discharge enabling transistors DT1-DTn, a programmable coding is provided for selectively controlling the activation of the discharge of the different bit lines. Specifically, each bit line BL1-BLn has associated therewith a controlled discharge switch DS1-DSn, for example a discharge transistor, particularly an N-channel MOSFET similar to the discharge transistors DT1-DTn of the previous embodiment; the controlled discharge switch DS1-DSn is selectively activatable for connecting the respective bit line to the reference voltage distribution line, so as to discharge the bit line stray capacitance (not shown for simplicity in FIG. 4).

In the example shown in the drawing, it is assumed that the bit lines BL1-BLn of the matrix 105 are ideally gathered in groups BL1-BLj, . . . , BLk-BLn of bit lines, each bit line group including a same number of bit lines (in the drawing, the bit lines of a same group are depicted as physically adjacent in the matrix 105, but this is not to be construed as limitative). At least one similar group of redundant bit lines RBL1-RBLj is also provided, made up of redundant memory cells RMC. The redundant bit line group RBL1-RBLj include a number of redundant bit lines equal to the number of bit lines in each bit line BL1-BLj, . . . , BLk-BLn, and is exploited for functionally replacing any one of the bit line groups BL1-BLj, . . . , BLk-BLn in case of one or more defects are discovered therein.

The choice of the actual number of bit lines to be included in each bit line group depends on design, architectural and semiconductor chip area considerations, because a bit line group will be in this case the elemental unit that can be functionally repaired in block.

All the discharge switches DS1-DSj, . . . , DSk-DSn associated with the bit lines of a same bit line group BL1-BLj, . . . , BLk-BLn are controlled by a same bit line group discharge enabling signal DSC1-DSCq that, in the shown example, drives the gates of the discharge MOSFETs. The discharge enabling signals DSC1-DSCq are generated by a bit line group discharge control circuit 400. The activation of the discharge enabling signals DSC1-DSCq (to a variable activation voltage value, as described in detail in the following) by the bit line group discharge control circuit 400 is conditioned to the assertion of the bit line discharge enable signal DCSen, received from the memory control circuitry 135. Additionally, the bit line group discharge control circuit 400 implements a programmable, selective activation scheme of the different bit line group discharge enabling signals DSC1-DSCq, thereby in case one of the bit line groups BL1-BLj, . . . , BLk-BLn has been functionally replaced (in jargon, repaired) by the redundant bit line group RBL1-RBLj, for example because one of the bit lines in the repaired bit line group contained a short-circuited bit line/word line pair, the bit line group discharge enabling signal DSC1-DSCq associated with the repaired bit line group is not activated, or it is activated at a voltage level such as to significantly limit the discharge current sustained by the corresponding discharge transistors DS1-DSj, . . . , DSk-DSn, thereby the possible flow of crowbar currents is avoided.

Figure 5:
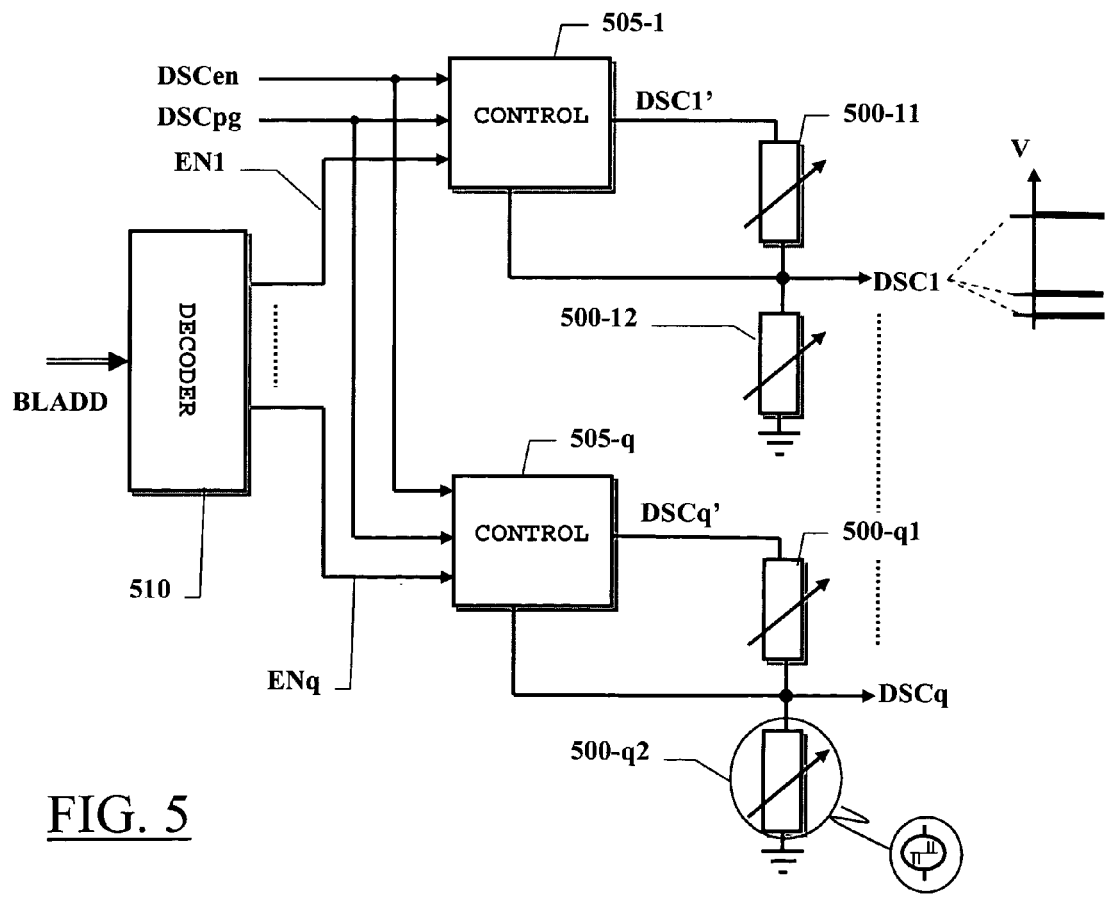
FIG. 5 shows the structure of a bit line group discharge control circuit depicted as a block in FIG. 4, according to an embodiment of the present invention.

A possible implementation of the bit line group discharge control circuit 400 is schematically shown in FIG. 5. The generic bit line group discharge enabling signal DSC1-DSCq is tapped off from an intermediate node of a respective programmable voltage partition network 500-11, 500-12-500-*q*1, 500-*q*2, made up of programmable, variable impedance elements, particularly programmable variable resistance elements, for example based on a phase-change material similar to the storage elements P of the memory cells MC.

A respective programming circuit 505-1-505-*q* is associated with each programmable voltage partition network 500-11, 500-12-500-*q*1, 500-*q*2. The operation of the programming circuits 505-1-505-*q* is controlled by a common program enable signal DSCpg, generated by the memory control circuit 135, and by individual program enabling signals EN1-ENq, generated by a decoder 510 that receives (from the redundancy control circuitry included in the memory control circuit 135) and decodes a bit line group address code BLADD identifying the bit line group BL1-BLj, . . . , BLk-BLn that has been repaired. The programming circuits 505-1-505-*q* are adapted to generate voltages suitable to program the phase-change material elements, i.e. suitable to put the phase-change material elements either in the set or in the reset state; to this purpose, the programming circuits 505-1-505-*q* may include a circuitry similar to that used in the memory write circuits 120 for programming the memory cells MC, i.e. circuits adapted to apply voltage pulses of different amplitude to the phase-change material elements, for rising the temperature thereof over a nucleation or a melting temperature.

In particular, when it is intended to limit or even cut off the discharge current of a given bit line group, because one or more bit lines in such a group are defective, the program enable signal DSCpg is asserted by the memory control circuit 135, and the address code BLADD of that bit line group (stored in the CAM 155 of the redundancy circuitry) is supplied to the decoder 510, which asserts a specified one of the enable signals EN1-ENq, corresponding to that bit line group address code. The respective programming circuit 505-1-505-$q$ thus causes the variable resistance elements 500-11, 500-12-500-$q$1, 500-$q$2 in the associated voltage partition network to be put in the reset state. Then, during a normal operation of the memory, when a bit line discharge phase is entered and the discharge enable signal DSCen is asserted, a full voltage is placed by each circuit 505-1-505-$q$ across the respective voltage partition network, on a line DSC1'-DSCq'; if the two variable resistance elements 500-11, 500-12-500-$q$1, 500-$q$2 of a given voltage partition network are respectively in the set state and in the reset state (low resistance and high resistance, respectively), the corresponding bit line group discharge enabling signal DSC1-DSCq will take the full voltage present on the line DSC1'-DSCq'; the respective discharge transistor DS1-DSn will thus be strongly turned on, and a relatively large discharge current will flow therethrough. If instead the two variable resistance elements 500-11, 500-12-500-$q$1, 500-$q$2 of a given voltage partition network are respectively in the reset state and in the set state (high resistance and low resistance, respectively), the corresponding bit line group discharge enabling signal DSC1-DSCq will be relatively low in voltage compared to the voltage level present on the corresponding line DSC1'-DSCq'; the associated discharge transistor DS1-DSn will thus be only weakly turned on (or, possibly, kept off), thereby the discharge current will be limited.

Each bit line group discharge enabling signal DSC1-DSCq can thus take three different voltage values: a first voltage value, equal to the reference voltage, when the bit line discharge phase is not entered (signal DSCen deasserted); during the bit line discharge phase, until the signal DSCen is asserted, the generic bit line group discharge enabling signal DSC1-DSCq may take a second, higher voltage value (e.g., around 1.5V), adapted to allow the discharge transistor DS1-DSn sustaining a relatively large bit line discharge current, or a third, lower voltage value (possibly proximate to the reference voltage, for example around 800 mV), adapted to cause the discharge transistor DS1-DSn to at least limit the bit line discharge current, the second and third voltage values depending on the programming of the respective voltage partition network 500-11, 500-12-500-$q$1, 500-$q$2.

It is pointed out that although in the foregoing a discharge switch control decoding scheme by groups of bit lines has been described, nothing prevents one in principle from implementing a finer discharge switch control decoding, down to the level of the single bit line, although this solution may result in a larger circuit area.

It is also observed that although in the foregoing the memory device has been assumed to include one memory matrix 105, the memory cells MC may be arranged in two or more matrixes, also referred to in jargon as "tiles". With reference to the embodiment described in connection with FIG. 4, in this case several bit line group discharge control circuits 400 might be provided, one for each tile, selected via a tile address code stored in the CAM 155 of redundancy circuitry.

Thanks to the bit line discharge control according to the previously described embodiments of the present invention, it is possible to control the bit line discharge currents; thus, it is possible to prevent the flow of relatively large crowbar currents arising when in the memory matrix one or more defective bit lines exist that exhibit a low-resistance path, or a short-circuit, to a matrix word line. Thanks to this, not only the overall current consumption of the memory device can be kept low, but also the operation of the memory device as a whole is not compromised, especially in case the voltages necessary for accessing the memory cells are generated on-chip by charge pump voltage generators.

It is however observed that in case of a short-circuit between a bit line and a word line, a slight current may still flow from the word line deselection voltage distribution line Vh that supplies the word line drivers, to the reference voltage distribution line (e.g., the ground), through a circuit path including the defective word line, the short-circuit to the defective bit line and the memory cell MC that belongs to the defective bit line and to another, non-defective word line being selected. For better clarity, referring to FIG. 6, assuming that a short circuit exists between the generic bit line BLk and the generic word line WLh, and that another generic word line WLj is selected by the word line selector circuits 110 (bringing the potential thereof to ground), a slight current flows from the voltage line Vh through the word line driver 130-$h$ of the defective word line WLh, the short circuit 150, the defective bit line BLk, the storage element P and the emitter-base junction of the respective selection BJT T of the memory cell MC belonging to the defective bit line BLk and the non-defective, selected word line WLj and, finally, the word line driver 130-$j$ thereof. It is pointed out that such a current is normally small, being limited to the current carried by the selection BJT T; in particular, this current depends on the emitter area of the BJT T, and thus on the dimensions of the memory cell MC, and in current technologies is not higher than 700-800 $\mu\Box$. However, it may happen that the charge-pump voltage generator generating the word line deselection voltage Vh is not capable of delivering this extra current, and/or the spurious increase in the voltage of the selected word line WLj (due to the slight voltage drop on the word line driver 130-$j$ caused by the base current of the selection BJT T, equal to the emitter current divided by a factor equal to the transistor beta plus 1) is considered unacceptable.

Figure 6:
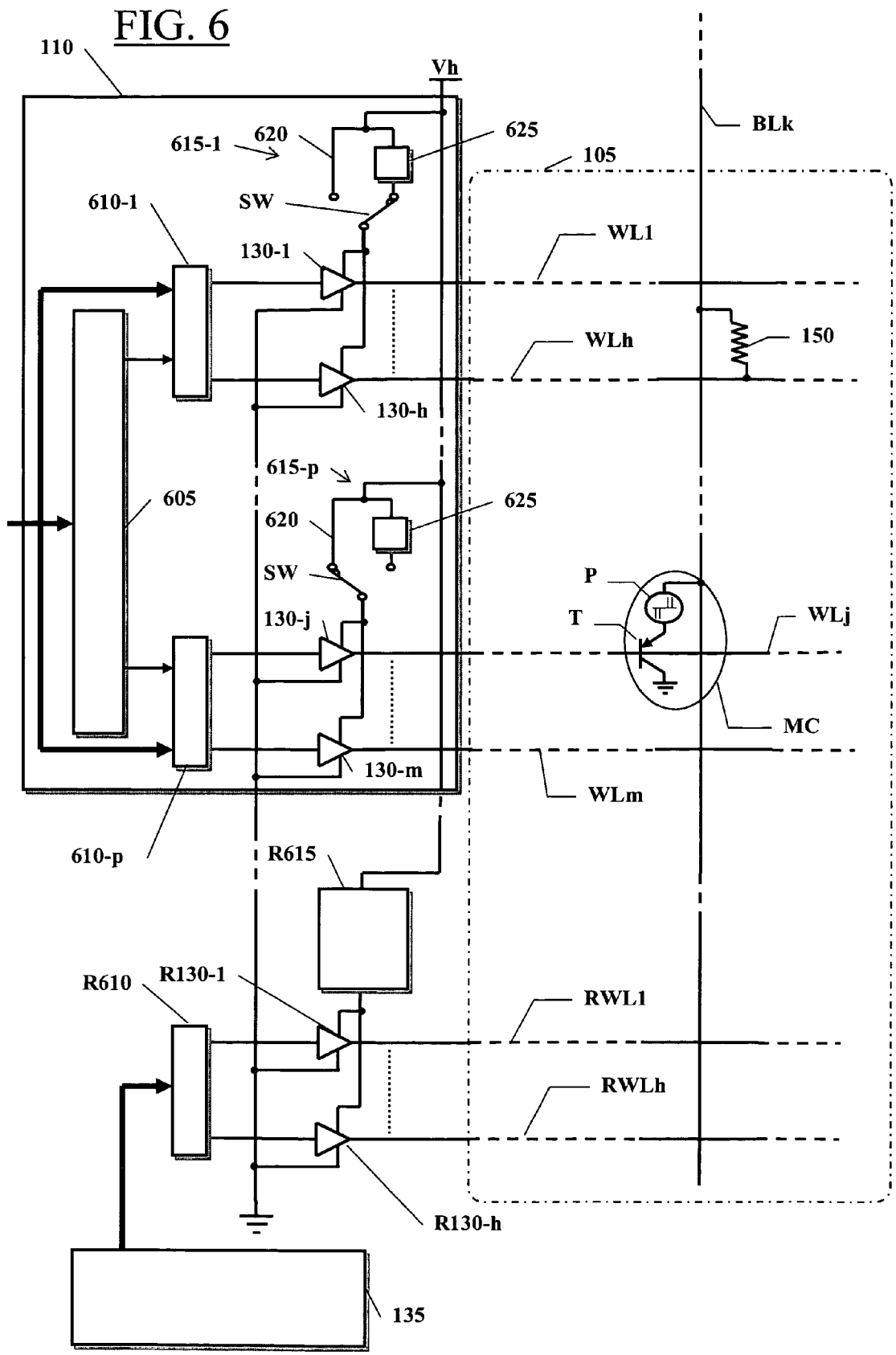
FIG. 6 shows the structure of a word line driver supply control according to another embodiment of the present invention, adapted to be used either in substitution of, or in combination with the bit line discharge control of the previous embodiments.

FIG. 6 schematically shows an embodiment of the invention adapted to avoid the flow of even this slight current. The word lines WL1-WLm are gathered in groups WL1-WLh, . . . , WLj-WLm of word lines, each word line group including a same number of word lines (in the drawing, the word lines of a same group are depicted as physically adjacent in the matrix 105, but this is not to be construed as a limitation). At least one similar group of redundant word lines RWL1-RWLh is also provided, made up of redundant memory cells RMC; the redundant word line group RWL1-RWLh includes a number of redundant word lines equal to the number of word lines in each word line group WL1-WLh, . . . , WLj-WLm, and is exploited for functionally replacing any one of the word line groups WL1-WLh, . . . , WLj-WLm in case one or more defects are discovered therein. As far as the number of word lines to be included in each word line group is concerned, considerations similar to those made in connection with the bit line groups of FIG. 4 can be made.

Also schematically shown in FIG. 6 is a two-level row address code decoding scheme, with a first-level decoder, or predecoder 605, for the selection of one word line group among the different word line groups WL1-WLh, . . . , WLj-WLm, and a number of second-level decoders 610-1-610-$p$, each one associated with a respective word line group, for selecting one word line within the selected word line group.

A word line driver supply control scheme is implemented, according to which all the word line drivers 130-1-130-h, . . . , 130-j-130-m driving the word lines of a same word line group receive the supply voltage from the supply voltage distribution line Vh through a respective switchable path arrangement 615-1-615-p, including a switch SW adapted to switching a connection to the voltage supply line Vh of a voltage supply terminal of the respective word line driver 130-1-130-h, . . . , 130-j-130-m between a first path 620, having a negligible resistance, and a second path 625, having a high (possibly, substantially infinite) resistance. The second path 625 may for example include a resistive element having a sufficiently high resistance, for example a phase-change material based element similar to the storage elements P of the memory cells, or a current generator adapted to limiting the current flow to a prescribed value, for example approximately 10 µA, or a transistor (e.g., a P-channel MOSFET) with a suitably controlled drive, so as to limit the current flowing therethrough. Any current-limiting element, device or circuit arrangement can in general be used, even a simple open circuit.

Redundancy word line drivers R130-1-R130-h are also shown, driving the redundancy word lines RWL1-RWLh in response to a redundancy word line address decoder R610, performing a function similar to the decoders 610-1-610-p on a redundancy word line address code provided by the redundancy control circuitry 135. A switchable path arrangement R615-1 similar to those provided for the word line drivers 130-1-130-h, . . . , 130-j-130-m is preferably provided for the redundancy word line drivers R130-1-R130-h.

The defect represented by the short-circuit 150 between the word line WLh and the bit line BLk is repaired by functionally replacing the word line group WL1-WLh to which the defective word line belong with the redundant word line group RWL1-RWLh, and functionally replacing the defective bit line BLk with a redundancy bit line, for simplicity not depicted in FIG. 6 (or, as shown in FIG. 4, replacing the bit line group to which the defective bit line BLk belongs with the redundant bit line group RBL1-RBLj). In addition, the switchable path arrangement 615-1 of the defective word line group WL1-WLh is set to the second, high resistance path, thereby the current that can be delivered by the voltage distribution line Vh to the word line drivers 1301-130-h is significantly limited, possibly reduced to zero. For example, the setting of the switchable path arrangement may be accomplished at the same time as the address of the defective word line group is written into the redundancy control circuitry 135.

In other words, in this embodiment of the invention a controlled current limiting arrangement is provided in a circuit path associated with a word line and bit line pair and including one of the word line driver circuits, the associated word line, one of the bit lines and the associated bit line discharge circuit, and the current limiting arrangement is capable of at least limiting a current flowing through the circuit path in response to an indication of defectiveness of at least one among the word line and the bit line.

In this way, not only is the defect 150 repaired, and the crowbar current flowing through the short-circuit 150 in the bit line discharge phase significantly limited or, possibly, reduced to zero, but the problems of spurious currents flowing through the defective word lines and bit lines are also solved.

It is pointed out that, as discussed in connection with the invention embodiment depicted in FIG. 4, also in the present case nothing prevents in principle from implementing a finer word line driver controlled supply scheme, down to the level of the single word line, although this solution may result in a larger area.

It is observed that the word line driver controlled supply according to the embodiment depicted in FIG. 6 may be used in substitution of, or in conjunction with the previously described embodiments of the present invention.

In other words, according to an embodiment of the present invention, the undesired crowbar current that would flow during the bit line discharge phase due to the presence of a low-resistance path or short-circuit between a word line and a bit line is substantially reduced or even avoided by providing a control of the current allowed to flow through the bit line in the discharge phase, and such a current control can for example be actuated either at the level of the bit line discharge circuit, or at the level of the word line driver associated with the word line short-circuited to the bit line.

Thanks to embodiments of the present invention, the existence of defects such as a low-resistance path, or a short-circuit, between a matrix bit line and a matrix word line can be remedied by simply functionally replacing the defective bit line and word line pair with a redundant pair of a bit line and a word line, without the need of discarding the memory device or functionally replacing the whole memory matrix ("tile").

Embodiments of the present invention also make it feasible to adopt a different bit line discharge policy compared to the one conventionally followed. It has been observed that the conventional bit line discharge policy, providing for carrying out a bit line discharge operation before any memory operation involving the selection of a word line, such as upon leaving a stand-by condition, has the disadvantage that the bit line discharge time adds up to the memory access time. Such a discharge time is not negligible, because during stand-by the bit line voltage normally reaches the word line deselection voltage, typically 4.5 V; if the bit line stray capacitance is of the order of some nF, the time necessary for discharging such a capacitance to ground may easily be of some µs. On the other hand, having highly conductive bit line discharge transistors for speeding up the bit line discharge is not practical, because of reasons of semiconductor chip area, and of noise induced on the memory reference voltage (similarly to what happen in fast output buffers). This problems may be solved if the bit line discharge circuits 125-1-125-n, instead of being temporarily activated before any access to the memory, are always kept activated, except during the access (read or write) to the memory, and the word line deselection voltage during stand-by is reduced from 4.5 V to, e.g., 2V (the word line deselection value during a read access to the memory); in other words, the bit line discharge phase is not limited to a relatively short time interval before any access operation, but lasts for all time preceding and following a memory access. In this way, not only is the amount of the leakage currents greatly reduced, but the bit lines are always kept at the reference voltage, and there is no need to preliminary discharge the bit line stray capacitances upon leaving stand-by. Thanks to embodiments of the presence invention, the presence of a defective pair of short-circuited bit line and word line does not cause problems of crowbar current, because the associated bit line discharge circuit will be disabled.

A memory, such as the memory 100 of FIG. 1, may be incorporated into an electronic system such as a computer system according to an embodiment of the invention.

Although the present invention has been disclosed and described by way of some embodiments, it is apparent to those skilled in the art that several modifications to the described embodiments, as well as other embodiments of the present invention are possible without departing from the scope thereof as defined in the appended claims.

What is claimed is:

1. A method of controlling a discharge of bit lines of a matrix of memory cells, comprising
controlling a value of a current flowing through a bit line of the matrix during a bit line discharge phase in response to an indication that the bit line is defective.

2. The method according to claim 1, in which said controlling the value of the current flowing through the bit line includes at least limiting the current flowing through the bit line in response to the indication that the bit line is defective.

3. The method according to claim 1, in which said indication that the bit line is defective comprises an indication that the bit line has been functionally replaced by a corresponding redundant bit line.

4. The method according to claim 3, in which said indication that the bit line has been functionally replaced by a corresponding redundant bit line is the presence of a bit line identifier code in a list of defective bit line identifier codes stored in the memory.

5. The method according to claim 4, in which said controlling the value of the current flowing through the bit line during the discharge phase responsive to an indication that the bit line is defective comprises at least limiting a bit line discharge current in case the bit line identifier code is in the list of defective bit line identifier codes.

6. The method according to claim 4, in which said controlling the value of the current flowing through the bit line during the discharge phase in responsive to an indication that the bit line is comprises at least limiting a value of a current delivered to a matrix word line in defectiveness relationship with the bit line, particularly a word line connected to the bit line by a low-resistance path.

7. The method according to claim 4, in which said memory cells are ovonic unified memory cells, each one including a phase-change material storage element.

8. A method of accessing memory cells in a memory cell matrix with matrix word lines and matrix bit lines, comprising, before selecting a specified matrix word line, discharging matrix bit lines, wherein
said act discharging the matrix bit lines is accomplished according to the method according to claim 1.

9. A circuit for controlling a discharge of bit lines of memory cells in a memory matrix, comprising:
bit line discharge means, associated with the bit limes, activatable in a bit line discharge operating phase of the memory for enabling a discharge of bit line capacitances associated with the bit lines, comprising
bit line current control means, controllable for at least limiting a current flowing through one of the bit lines in the bit line discharge operating phase in response to an indicating that the one bit line is defective.

10. The circuit according to claim 9, in which said indication of defectiveness is stored in a redundancy control circuitry of the memory, controlling the functional replacement of defective bit lines with redundant bit lines.

11. The circuit according to claim 9, in which said bit line current control means include, associated with each bit line, a feedback control loop comprising a variable-impedance element arranged so as to be run through by a current corresponding to a bit line discharge current in the bit line discharge operating phase, and providing a control voltage to a discharge current flow controlling device, said control voltage depending on the impedance of the variable-impedance element and acting in negative feedback on the bit line discharge current.

12. The circuit according to claim 11, in which said bit line discharge means include, associated with each bit line, means activatable for establishing a bit line discharge path, and in which the variable-impedance element is inserted in the discharge path, said variable-impedance element having an impedance selectively programmable in one of at least two impedance values, thereby a voltage drop across the variable-impedance element causes a limitation of the bit line discharge current flowing through the means for establishing a bit line discharge path.

13. The circuit according to claim 11, in which said variable-impedance elements comprise elements made of a phase-change material, particularly calcogenide material, selectively programmable in either one of a first phase, exhibiting a first impedance value, and a second phase, exhibiting a second impedance value significantly higher than the first impedance value.

14. The circuit according to claim 9, in which said bit line discharge control means include, associated with each bit line, means activatable for establishing a discharge path of at least one associated bit line, and in which said bit line current control means include a programmable control circuit controlling the activation of the means for establishing the discharge path, said programmable control circuit being programmable for selectively conditioning the activation of the means for establishing the discharge path to a specified condition.

15. The circuit according to claim 14, in which said programmable control circuit includes programmable voltage-level conditioning means, programmable for conditioning a voltage level of a respective drive signal driving at least one respective of said means for establishing the discharge path.

16. The circuit according to claim 15, in which said voltage-level conditioning means include a voltage partitioner comprising programmable variable-resistance elements.

17. The circuit according to claim 16, in which said programmable variable-resistance elements comprise elements made of a phase-change material, particularly calcogenide material.

18. The circuit according to claim 10, in which said bit line current control means comprises a current limiting arrangement controllable for at least limiting a value of a current delivered to a matrix word line in defectiveness relationship with the bit line.

19. A semiconductor memory including at least one matrix of memory cells, and a bit line discharge circuit for controlling a discharge of matrix bit lines wherein
the bit line discharge circuit is realized in accordance to claim 9.

20. A semiconductor memory, including at least one matrix of memory cells, matrix word lines, a word line driver circuit associated with each word line for driving the word line, matrix bit lines and, associated with each bit line, a bit line discharge circuit, wherein
a controlled current-limiting arrangement is provided in a circuit path associated with a word line and bit line pair and including one of the word line driver circuits driving the word line of the pair, the associated word line, one of the bit lines and the associated bit line discharge circuit,
said current limiting arrangement being capable of at least limiting a current flowing through the circuit path in response to an indication of defectiveness of at least one among the word line and the bit line of the pair.

21. A memory, comprising:
a bit line;
a redundancy circuit operable to indicate that the bit line is defective; and
a discharge circuit coupled to the bit line and to the redundancy circuit and operable to limit a discharge current flowing through the bit line to a first predetermined value in response to the redundancy circuit.

22. The memory of claim 21 wherein:
the bit line comprises a matrix bit line; and
the redundancy circuit
  comprises a redundant bit line, and
  is operable to replace the matrix bit line with the redundant bit line if the matrix bit line is defective.

23. The memory of claim 21 wherein the discharge circuit comprises a phase-change-material storage element having a resistance corresponding to the predetermined value of the discharge current.

24. The memory of claim 21, further comprising:
a word line; and
a driver coupled to the word line and operable to drive the word line with a current and to limit the drive current to a second predetermined value.

25. The memory of claim 21, further comprising an ovonic unified memory cell coupled to the bit line.

26. The memory of claim 21, further comprising:
parasitic capacitor coupled the bit line; and
wherein the discharge circuit is operable to discharge the parasitic capacitor.

27. The memory of claim 21, further comprising a word line that is coupled to the bit line via an undesired conductive path.

28. A memory, comprising:
a word line;
a redundancy circuit operable to indicate that the word line is defective; and
a driver coupled to the word line and to the redundancy circuit and operable to drive the word line with a drive current and to limit the drive current to a first predetermined value in response to the redundancy circuit.

29. The memory of claim 28 wherein:
the word line comprises a matrix word line; and
wherein the redundancy circuit
  comprises a redundant word line, and
  is operable to replace the matrix word line with the redundant word line if the matrix word line defective.

30. The memory of claim 28 wherein the driver comprises a phase-change-material storage element having a resistance corresponding to the predetermined value of the drive current.

31. The memory of claim 28, further comprising an ovonic unified memory cell coupled to the word line.

32. The memory of claim 28, further comprising:
a bit line;
a conductive path that couples the bit line to the word line and that renders the bit and word lines defective.

33. The memory of claim 28 wherein the driver is programmable.

34. An electronic system, comprising:
a memory having,
  a bit line,
  a redundancy circuit operable to indicate that the bit line is defective, and
  a discharge circuit coupled to the bit line and to the redundancy circuit and operable to limit a discharge current flowing through the bit line to a first predetermined value in response to the redundancy circuit.

35. An electronic system, comprising:
a memory having,
  a word line,
  a redundancy circuit operable to indicate that the word line is defective, and
  a driver coupled to the word line and to the redundancy circuit and operable to drive the word line with a drive current and to limit the drive current to a first predetermined value in response to the redundancy circuit.

36. A method, comprising:
discharging a bit line; and
limiting a discharge current through the bit line to a predetermined value if the bit line is defective.

37. A method, comprising:
discharging a first bit line with a first discharge current;
discharging a second bit line with a second discharge current such that the second discharge current is limited to a predetermined level that is lower than a level to which the first discharge current is limited; and
accessing a memory cell coupled to the first bit line after discharging the first and second bit lines.

38. The method of claim 37, further comprising prohibiting access to a memory cell coupled to the second bit line.

39. The method of claim 37 wherein:
discharging the first bit line comprises coupling the first bit line to a reference node via a first impedance; and
discharging the second bit line comprises coupling the second bit line to the reference node via a second impedance that is greater than the first impedance.

40. The method of claim 37, further comprising identifying the second bit line as defective before discharging the first and second bit lines.

41. A method, comprising:
driving a word line; and
limiting a drive current through the word line to a predetermined value if the word line is defective.

42. A method of accessing memory cells in a memory cell matrix having a plurality of matrix word lines and a plurality of matrix bit lines, wherein said accessing includes selecting a matrix word line and at least one matrix bit line, the method comprising:
before selecting a specified matrix word line:
  keeping the plurality of matrix word lines at a predetermined deselection potential higher than a reference potential;
  keeping the plurality of matrix bit lines floating;
  discharging the matrix bit lines to the reference potential, bringing the selected word line to the reference potential, and
  bringing the selected bit line to a potential that depends on an operation to be performed on the accessed memory cell, wherein said discharging includes limiting a value of a current flowing through a bit line of the matrix during the bit line discharge phase in response to an indication of defectiveness of the bit line.

43. A semiconductor memory including at least one matrix of memory cells having a plurality of word lines and a plurality of bit lines, the semiconductor memory comprising:
word line selection circuits and bit line selection circuits for selecting the word lines and the bit lines respectively, wherein before a specified matrix word line is selected the word line selection circuits are adapted to keep the plurality of matrix word lines at a predetermined deselection potential higher than a reference potential, and the bit line selection circuits are adapted to keep the plurality of matrix bit lines floating, the word line selection circuits being further adapted to bring the selected word line to the reference potential, and the bit line selection circuits being further adapted to bring the selected bit line to a potential that depends on an operation to be performed on the accessed memory cell;

a circuit for controlling a discharge of bit lines of memory cells in a memory matrix, comprising:

bit line discharge means, associated with the bit lines, activatable in a bit line discharge operating phase of the memory before the word line selection circuits brings the selected word line to the reference potential for enabling a discharge to the reference potential of bit line capacitances associated with the bit lines, and bit line current control means, controllable for at least limiting a current flowing through one of the bit lines during the bit line discharge operating phase in response to an indication that the one of the bit lines is defective.

* * * * *